(12) United States Patent
Ishida et al.

(10) Patent No.: US 6,423,601 B1
(45) Date of Patent: *Jul. 23, 2002

(54) RETROGRADE WELL STRUCTURE FORMATION BY NITROGEN IMPLANTATION

(75) Inventors: Emi Ishida; Ming Yin Hao, both of Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/667,685

(22) Filed: Nov. 14, 2000

Related U.S. Application Data

(60) Provisional application No. 60/155,604, filed on Sep. 24, 1999.

(51) Int. Cl.$^7$ .............................................. H01L 21/336
(52) U.S. Cl. .................... 438/306; 438/528; 438/530
(58) Field of Search ................................ 438/305, 306, 438/407, 528, 530, 966

(56) References Cited

U.S. PATENT DOCUMENTS

| | | | |
|---|---|---|---|
| 5,885,886 A | * | 3/1999 | Lee ............................ 438/528 |
| 6,194,259 B1 | * | 2/2001 | Nayak et al. ................ 438/528 |

* cited by examiner

*Primary Examiner*—Chandra Chaudhari

(57) ABSTRACT

Submicron-dimensioned, p-channel MOS transistors and CMOS devices a formed using nitrogen and boron co-implants for forming p-type well regions, each implant having a parabolically-shaped concentration distribution profile. During subsequent thermal annealling, boron-doped wells are formed, each having a retrograde-shaped concentration distribution profile exhibiting a peak boron concentration at a preselected depth below the semiconductor substrate surface. The inventive method reduces "short-channel" effects such as "punch-through" while maintaining high channel mobility.

19 Claims, 1 Drawing Sheet

RETROGRADE WELL STRUCTURE FORMATION BY NITROGEN IMPLANTATION

RELATED APPLICATIONS

This application claims priority from Provisional Application Serial No. 60/155,604 filed on Sep. 24, 1999 entitled: "RETROGRADE WELL STRUCTURE FORMATION BY NITROGEN IMPLANTATION", the entire disclosure of which is hereby incorporated by reference herein.

FIELD OF THE INVENTION

The present invention relates to a method of forming well-shaped, boron-doped regions in a semiconductor substrate, whereby a desired retrograde boron concentration distribution profile is obtained. The present invention has particular utility in the manufacture of MOS-type transistor devices and semiconductor integrated circuits with improved processing methodology resulting in increased reliability and quality, increased manufacturing throughput, and reduced fabrication cost. The present invention is also useful in the manufacture of CMOS semiconductor devices and has particular applicability in fabricating high-density integration semiconductor devices with design features below about 0.18 μm, e.g., about 0.15 μm.

BACKGROUND OF THE INVENTION

The escalating requirements for high density and performance associated with ultra large scale integration (ULSI) semiconductor devices requires design features of 0.18 μm and below, such a 0.15 μm and below, increased transistor and circuit speeds, high reliability, and increased manufacturing throughput for economic competitiveness. The reduction of design features to 0.18 μm and below challenges the limitations of conventional semiconductor manufacturing techniques.

As feature sizes of MOS and CMOS devices have decreased to the sub-micron range, so-called "short-channel" effects have arisen which tend to limit device performance. For n-channel MOS transistors, the major limitation encountered is caused by hot-electron-induced instabilities. This problem occurs due to high electrical fields between the source and the drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, shallow junction, lightly- or moderately-doped source/drain extension-type transistor structures have been developed, as described below.

For p-channel MOS transistors, the major "short-channel" effect which limits performance arises from "punch-through" effects which occur with relatively deep junctions. In such instances, there is a wider sub-surface depletion effect and it is easier for the field lines to go from the drain to the source, resulting in the above-mentioned "punch-through" current problems and device shorting. To minimize this effect, relatively shallow junctions are employed in forming p-channel MOS-type transistors.

The most satisfactory solution to date of hot carrier instability problems of MOS- and CMOS-type devices is the provision of lightly- or moderately-doped source/drain extensions driven just under the gate region, while the heavily-doped source/drain regions are laterally displaced away from the gate by use of a pair of spacers on opposite sidewalls of the gate. Such structures are particularly advantageous because they do not have problems with large lateral diffusion and the channel length can be set precisely.

However, in the case of p-channel MOS and CMOS devices, formation of p-type junctions having desired characteristics (e.g., depth, doping concentration profiles, etc.) by boron doping is problematic, principally due to the ease with which boron atoms diffuse in silicon semiconductor substrates. The rapidity of boron dopant atom diffusion upon thermal treatment for post-implantation activation/lattice damage relaxation disadvantageously results in a relatively flat concentration distribution profile, whereas a retrograde concentration distribution profile, i.e., a profile exhibiting a maximum or peak boron concentration at a preselected depth below the semiconductor substrate surface, is desirable and preferred for suppression of "short-channel" effects and maintenance of high channel mobility.

Thus a need exists for improved semiconductor manufacturing methodology for fabricating p-channel MOS and CMOS transistors which does not suffer from the above-described drawback associated with the rapid diffusion of boron atoms in silicon semiconductor substrates. Moreover, there exists a need for an improved process for fabricating MOS transistor-based devices with reduced short-channel effects and high channel mobility, which process is fully compatible with conventional process flow and provides increased manufacturing throughput and product yield.

The present invention fully addresses and solves the above-described drawback attendant upon conventional processing for forming submicron-dimensioned p-channel MOS and CMOS transistors for use in high-density integrated semiconductor devices, particularly in providing a process for forming boron-doped p-type wells in silicon semiconductor substrates, wherein the boron concentration distribution profile is advantageously retrograde-shaped, with a maximum or peak boron concentration at a preselected depth below the substrate surface, whereby "short-channel" effects are suppressed while maintaining high channel mobility.

DISCLOSURE OF THE INVENTION

An advantage of the present invention is an improved method for forming a boron-doped region in a semiconductor substrate, having a preselected maximum or peak boron concentratioh at a preselected depth below the surface of the substrate.

Another advantage of the present invention is an improved method for forming a boron-doped region in a semiconductor substrate, having a retrograde-shaped boron concentration distribution profile with a maximum or peak boron concentration at a preselected depth below the substrate surface.

Still another advantage of the present invention is an improved method for manufacturing a MOS transistor having at least one pair of boron-doped, well-shaped regions formed in a semiconductor substrate, each of the boron-doped well regions having a retrograde-shaped boron concentration distribution profile with a maximum or peak boron concentration at a preselected depth below the substrate surface.

Yet another advantage of the present invention is a silicon-based, MOS-type transistor device comprising boron-doped well regions each having a retrograde-shaped boron concentration distribution profile with a maximum or peak boron concentration at a preselected depth below the surface of a silicon semiconductor substrate and formed by the method of the present invention.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of forming a boron-doped region in a semiconductor, the boron-doped region having a retrograde-shaped boron concentration distribution profile exhibiting a maximum or peak boron concentration at a preselected depth below a surface of the semiconductor, which method comprises the steps of:

(a) providing a semiconductor having a surface;

(b) implanting nitrogen ions into the semiconductor surface, the implantation conditions chosen for providing a preselected, approximately parabolically-shaped nitrogen concentration distribution profile within the semiconductor with a peak nitrogen concentration at a depth below the semiconductor surface substantially corresponding to the preselected depth;

(c) implanting boron or boron-containing ions into the semiconductor surface, the implantation conditions chosen for providing a preselected, approximately parabolically-shaped boron concentration distribution profile within the semiconductor with a peak boron concentration at a depth below the semiconductor surface which is above, below, or substantially at the depth of the nitrogen concentration peak; and (d) thermally treating the nitrogen- and boron-implanted semiconductor at a temperature and for an interval sufficient to convert the parabolically-shaped boron concentration distribution profile into a retrograde-shaped profile comprising, in order from the semiconductor surface, a first, substantially constant (i.e., flat) concentration portion, a second, substantially parabolically-shaped varying concentration portion having a peak, and a third, substantially constant concentration portion, wherein the peak of the second, parabolically-shaped varying concentration portion substantially corresponds to the preselected depth below the semiconductor surface.

In embodiments according to the present invention, the boron concentrations in the first and third substantially constant concentration portions of the retrograde profile are approximately equal, and step (b) is performed prior to step (c), or alternatively, step (c) is performed prior to step (b).

In further embodiments according to the present invention, step (a) comprises providing a monocrystalline silicon (Si) semiconductor wafer of n-type or intrinsic (i.e., i-type) conductivity; the preselected depth of the peak boron concentration is about 800 Å below the wafer surface; step (b) comprises implanting $N^+$ or $N_2^+$ ions at a dosage of from about $1 \times 10^{14}$ to about $3 \times 10^{15}$ atoms/cm$^2$ at an energy of from about 2 KeV to about 50 KeV; step (c) comprises implanting $B^+$ or $BF_2^+$ ions at a dosage of from about $1 \times 10^{12}$ to about $5 \times 10^{13}$ atoms/cm$^2$ at an energy of from about 2 KeV to about 50 KeV; and step (d) comprises rapid thermal annealing (RTA) at from about 850 to about 1,050° C. for from about 1 to about 30 seconds or furnace annealing at from about 750 to about 900° C. for from about 5 minutes to about 1 hour.

According to another aspect of the present invention, a method of manufacturing a semiconductor device is provided, the semiconductor device comprising a semiconductor substrate having at least one pair of spaced-apart, boron-doped regions formed therein, each of the boron-doped regions having a retrograde-shaped boron concentration distribution profile exhibiting a peak boron concentration at a preselected depth below a surface of the semiconductor substrate, which method comprises the steps of:

(a) providing an n-type semiconductor wafer having a surface;

(b) implanting nitrogen ions into at least a pair of preselected, spaced-apart regions of said semiconductor wafer surface where source/drain regions are to be formed, the implantation conditions chosen for providing each of the implanted regions with a preselected, approximately parabolically-shaped nitrogen concentration distribution profile, with a peak nitrogen concentration at a depth below the semiconductor wafer surface substantially corresponding to the preselected depth;

(c) implanting boron or boron-containing ions into the preselected, spaced-apart regions of the semiconductor wafer surface, the implantation conditions chosen for providing each of the implanted regions with a preselected, approximately parabolically-shaped boron concentration distribution profile, with a peak boron concentration at a depth below the semiconductor wafer surface which is above, below, or substantially at the depth of the nitrogen concentration peak;

(d) thermally treating the nitrogen and boron-implanted semiconductor wafer at a temperature and for an interval sufficient to convert the parabolically-shaped boron concentration distribution profile of each of the implanted regions into a retrograde-shaped profile comprising, in order from the semiconductor wafer surface, a first, substantially constant concentration portion, a second, substantially parabolically-shaped varying concentration portion having a peak, and a third, substantially constant concentration portion, wherein the peak of the second, parabolically-shaped varying concentration portion substantially corresponds to the preselected depth below the semiconductor wafer surface; and (e) selectively forming a gate insulating layer on a preselected portion of the semiconductor wafer surface intermediate the implanted regions.

According to embodiments of the present invention, step (e) comprises selectively removing portions of an insulating layer formed over the semiconductor wafer surface during step (d); the inventive method further comprises the step (f) of forming a gate electrode layer contiguous with and in ohmic contact with the gate insulating layer; and the boron concentrations in the first and third portions of the retrograde-shaped profile are substantially equal.

According to further embodiments of the invention, step (a) comprises providing a monocrystalline Si wafer of n-type conductivity; step (b) is performed prior to performing step (c), or alternatively, step (c) is performed prior to performing step (b); the preselected depth of the peak boron concentration is about 800 Å below the wafer surface; step (b) comprises implanting $N^+$ or $N_2^+$ ions at a dosage of from about $1 \times 10^{14}$ to about $3 \times 10^{15}$ atoms/cm$^2$ at an energy of from about 2 KeV to about 50 KeV; step (c) comprises implanting $B^+$ or $BF_2^+$ ions at a dosage of from about $1 \times 10^{12}$ to about $5 \times 10^{13}$ atoms/cm$^2$ at an energy of from about 2 KeV to about 50 KeV; step (d) comprises rapid thermal annealing at from about 850 to about 1,050° C. for from about 1 to about 30 seconds, or alternatively, step (d) comprises furnace annealing at from about 750 to about 900° C. for from about 5 minutes to about 1 hour, preferably in an oxygen-containing atmosphere for forming a silicon oxide insulating layer over the wafer surface; step (e) comprises selectively removing portions of the silicon oxide insulating layer to form the gate insulating layer intermediate the implanted regions of the wafer; and step (f) comprises forming a heavily-doped polysilicon gate electrode layer.

According to yet another aspect according to the present invention, silicon-based MOS transistor devices formed by the method comprising the above-enumerated steps (a)–(f) are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will become evident, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiments of the present invention can best be understood when read in conjunction with the following drawings, in which.

DESCRIPTION OF THE INVENTION

The present invention addresses and solves problems arising from manufacturing submicron-dimensioned, MOS and CMOS transistors suitable for use in high-density integration semiconductor devices, wherein, as part of the fabrication methodology, boron or boron-containing ions are implanted into semiconductor substrates, e.g., monocrystalline silicon substrates, for forming p-type source/drain regions therein. More specifically, the present invention advantageously provides a significant improvement in the tailoring of the boron concentration distribution profile of the implanted regions, thereby minimizing or substantially avoiding "short-channel" problems such as "punch-through" which arise from conventional processing including boron ion implantation followed by thermal annealing for dopant activation/lattice damage relaxation. The inventive method thus increases device reliability and manufacturing throughput, while maintaining high channel mobility. In addition, the method of the present invention is fully compatible with other aspects of existing process methodology.

According to the present invention, a method of manufacturing MOS and CMOS transistors is provided which utilizes a nitrogen ion co-implant having a substantially parabolically-shaped concentration distribution profile with a peak nitrogen concentration at a desired depth below a semiconductor surface for providing a desired retrograde-shaped boron concentration distribution profile having a peak boron concentration after thermal annealing which is substantially coincident with the peak nitrogen concentration.

Figure 1:
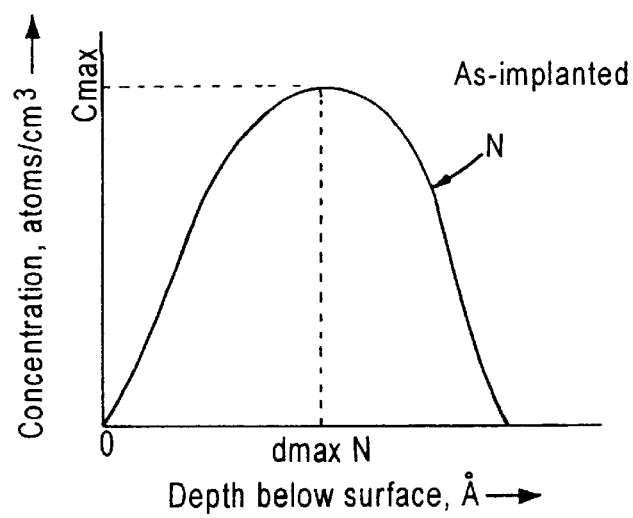
FIG. 1 illustrates, in graphical form, an as-implanted, parabolically-shaped, nitrogen concentration distribution profile in a silicon wafer substrate.
Figure 2:
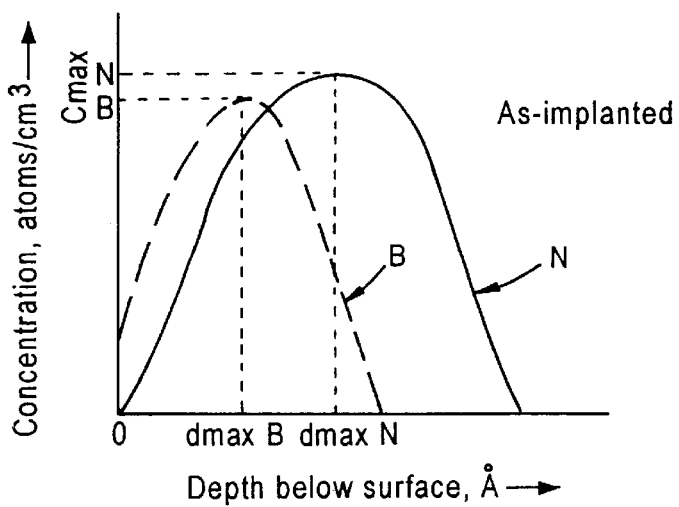
FIG. 2 illustrates, in graphical form, as-implanted, parabolically-shaped, nitrogen and boron concentration distribution profiles in a silicon wafer substrate.
Figure 3:
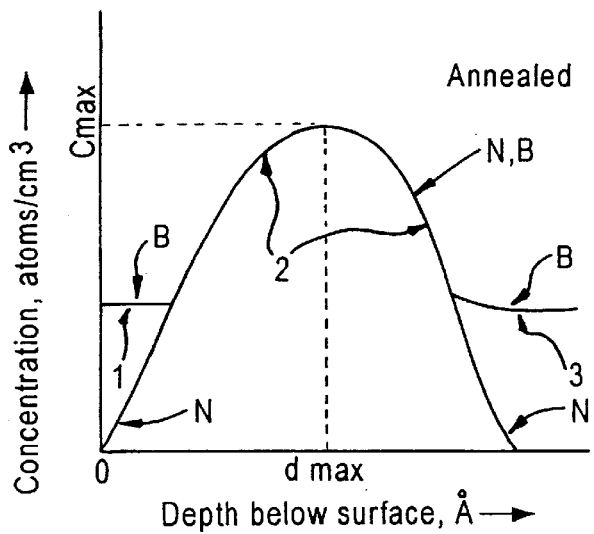
FIG. 3 illustrates, in graphical form, nitrogen and boron concentration distribution profiles after thermal annealing for formation of a retrograde-shape boron concentration distribution profile.

Referring now to FIGS. 1–3, shown therein is a series of graphical representations of dopant concentration distribution profiles for providing an understanding of the principles of the present invention and for performing an illustrative, but not limitative, embodiment of the present invention. Referring more particularly to FIG. 1, shown therein is a graph illustrating an as-implanted concentration distribution profile of nitrogen ions or atoms, i.e., the variation of the nitrogen concentration as a function of depth below the surface of a semiconductor substrate, e.g., n-type or intrinsic (i-type) monocrystalline silicon. In a first step according to a first embodiment of the inventive method, $N^+$ or $N_2^+$ ions are implanted under preselected conditions (e.g., implantation dosage, energy, and duration) so as to yield an approximately parabolically-shaped nitrogen concentration distribution profile having a preselected maximum concentration $c_{max\ N}$ at a preselected depth $d_{max\ N}$ below the surface of the semiconductor. According to the practice of the present invention, $c_{max\ N}$ and $d_{max\ N}$ are preselected so as to substantially correspond to desired, respective peak concentration and peak depth values of boron-doped well regions to be formed in the semiconductor for use in a particular device or application.

Referring now to FIG. 2, in a second step according to the first embodiment of the invention, boron or boron-containing ions are implanted under conditions providing an approximately parabolically-shaped as-deposited boron ion or atom concentration distribution profile. Implantation is performed under conditions (e.g., dosage, energy, and duration) for implanting a sufficient amount of boron ions for providing a preselected value of $c_{max\ B}$ in a later step. In addition, although in the illustration of FIG. 2, $d_{max\ B}$ of the parabolically-shaped concentration distribution profile is shown as occuring before $d_{max\ N}$, i.e., above the depth of the nitrogen peak, such is not critical for practice of the present invention. Accordingly, $d_{max\ B}$ may be above, below, or substantially at $d_{max\ N}$.

Referring now to FIG. 3, in a third step according to the inventive method, the nitrogen and boron co-implanted semiconductor is then subjected to a thermal annealing treatment for obtaining the desired retrograde-shaped boron concentration distribution profile shown therein. As illustrated, after thermal annealing, the retrograde-shaped boron concentration distribution profile comprises three (3) distinct portions in order from the semiconductor surface, i.e., a first, substantially constant (or flat) concentration portion 1, a second, substantially parabolically-shaped varying concentration portion 2 having a peak boron concentration $c_{max\ B}$ substantially equal to that of the peak nitrogen concentration $c_{max\ N}$, and substantially coincident therewith (i.e., $d_{max\ B} = d_{max\ N}$), and a third, substantially constant concentration portion 3, the boron concentrations of the first and third portions being approximately equal.

The thermal annealing treatment for producing the desired retrograde-shaped boron concentration distribution profile may comprise rapid thermal annealing (RTA) or furnace annealing, and the annealing atmosphere may comprise non-reactive (e.g., nitrogen, argon, etc.) or reactive (e.g., oxygen) ambients, the latter alternative being of particular utility in MOS type transistor formation processing, whereby a gate oxide layer can be formed concomitant with thermal annealing for obtaining retrograde-shaped boron concentration distribution profiles.

In a second, alternative embodiment according to the present invention, the boron implantation is performed prior rather than subsequent to the nitrogen implantation. The essential requirement of the inventive method is that both implantation steps be performed prior to any significant thermal annealing step. While the exact mechanism by which the nitrogen co-implant effectively "pins" $d_{max\ B}$ at $d_{max\ N}$ and thus permits tailoring and substantial control of the shape of the boron concentration distribution profile is not known with certainty, and not being bound by any particular theory, it is believed that mutual affinity or bonding of the more mobile boron ions or atoms and the less mobile nitrogen ions or atoms (relatively statically located within the lattice structure) results in the boron concentration distribution profile "tracking" the nitrogen distribution profile in the higher concentration, central portion 2.

EXAMPLE $N^+$ and/or $N_2^+$ ions were implanted into n n-type monocrystalline silicon wafers at dosages of from about $1\times10^{14}$ to about $3\times10^{15}$ atoms/cm$^2$ at implantation energies of from about 2 to about 50 KeV for intervals sufficient to produce parabolically-shaped nitrogen concentration distribution profiles having preselected values of $d_{max\ N}$ and $c_{max\ N}$. $B^+$ and/or $BF_2^+$ ions were then implanted at dosages of from about $1\times10^{12}$ to about $5\times10^{13}$ atoms/cm$^2$ at implantation energies of from about 2 to about 50 KeV to produce parabolically-shaped boron concentration distribution profiles having preselected values of $d_{max\ B}$ slightly below or slightly above $d_{max\ N}$ and values of $c_{max\ B}$ slightly below that of $c_{max\ N}$. Thermal annealing of the thus co-implanted semiconductors was performed by RTA at from about 850 to about 1,050° C. for from about 1 to about 30 seconds or by furnace annealing at from about 750 to about 900° C. for from about 5 minutes to about 1 hour. Following annealing, determination of the boron and nitrogen concentration distribution profiles, as by conventional analytical techniques, indicated substantial coincidence of $d_{max\ B}$ and $d_{max\ N}$ at about 800 Å below the semiconductor surface, as well as substantial equality of $c_{max\ B}$ and $c_{max\ N}$.

In a further embodiment according to the present invention, the above-described coimplantation, $c_{max}$ and $d_{max}$ equalization feature of the inventive method is advantageously utilized in a process for making p-channel MOS transistors or p-channel components of CMOS devices, comprising a semiconductor substrate having at least one pair of spaced-apart, boron-doped source/drain regions formed therein. Each of the source/drain regions has a retrograde-shaped boron concentration distribution profile exhibiting a peak boron concentration at a preselected depth below the surface of the semiconductor substrate.

According to this embodiment of the present invention, an n-type semiconductor substrate having a surface is initially provided, typically as a monocrystalline silicon wafer. In a first step, nitrogen ions are selectively implanted, as through a patterned mask and under conditions such as in the above-described example, into at least one pair of preselected, spaced-apart regions of the wafer surface where source/drain regions are to be formed. The implantation conditions, which are similar to those of the above-described Example, are chosen for providing each of the implanted regions with a preselected, approximately parabolically-shaped nitrogen concentration distribution profile similar to that shown in FIG. 1, with a peak nitrogen concentration at a depth below the semiconductor wafer surface substantially corresponding to the preselected, desired boron peak concentration depth.

In a second step, boron or boron-containing ions are selectively implanted into the preselected regions of the surface, as by use of the patterned mask employed in the first step, under conditions similar to those employed in the above-described Example, for providing each of the regions with a preselected, approximately parabolically-shaped boron concentration distribution profile having a desired peak boron concentration at a depth below the wafer surface which is above, below, or substantially at the nitrogen concentration peak. As an example, at this stage of the process, each of the spaced-apart source-drain regions may exhibit nitrogen and boron concentration distribution profiles similar to those shown in FIG. 2.

In a third step, the nitrogen- and boron-implanted wafer is thermally treated, e.g., by RTA or furnace annealing under conditions similar to those of the above-described Example, at a temperature and for an interval sufficient to convert the parabolically-shaped boron concentration distribution profile of each of the implanted source/drain regions into a retrograde-shaped profile comprising, in order from the wafer surface, a first, substantially constant concentration portion, a second, substantially parabolically-shaped portion having a peak boron concentration at a depth below the wafer surface which is substantially coincident with that of the nitrogen concentration distribution profile (typically about 800 Å below the wafer surface) and similar boron concentration, and a third, substantially constant concentration portion having a boron concentration approximately equal to that of the first portion, similar to that shown in FIG. 3.

When the third, or thermal annealing step, is performed in a reactive (i.e., oxidizing) atmosphere, as by furnace annealing in an oxygen or oxygen-containing atmosphere, the thin silicon oxide layer which resultingly forms over the wafer surface may be selectively patterned, as by conventional photolithographic masking/etching techniques, and the portions thereof intermediate the co-implanted and annealed source/drain regions utilized as gate insulative layers for MOS or CMOS transistor formation. A gate electrode layer is then formed thereon in conventional manner, typically by use of heavily-doped polysilicon. If the thermal annealing step is performed in an inert atmosphere, the gate insulating layer/gate electrode layer stack may be formed thereafter by conventional techniques (not described herein for brevity).

In an alternative embodiment according to the present invention, the boron implantation step is performed prior to the nitrogen implantation. As before, both implantations must be performed prior to the thermal annealing step, whether or not the latter is conducted in an inert or oxidizing atmosphere.

The present invention thus enables rapid, reliable formation of improved submicron-dimensioned p-channel MOS transistors devices at increased rates of manufacturing throughput, by utilizing a relatively simple co-implantation process for achieving desired p-well boron dopant implant depths and profiles, whereby "short channel" effects such as "punch through" are avoided or at least minimized, while maintaining high channel mobility.

Finally, the present invention is applicable to the formation of other types of transistors and devices, e.g., CMOS devices and is fully compatible with conventional process flow for automated manufacture of high-density integration semiconductor devices.

In the previous description, numerous specific details are set forth, such as specific materials, structures, reactants, processes, etc. in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed:

1. A method of forming a boron-doped region in a semiconductor, the boron-doped region having a retrograde-shaped boron concentration distribution profile exhibiting a peak boron concentration at a preselected depth below a surface of the semiconductor, which method comprises the steps of:
   (a) providing a semiconductor having a surface;
   (b) implanting nitrogen ions into the semiconductor surface, the implantation conditions chosen for providing a preselected, approximately parabolically-shaped nitrogen concentration distribution profile within said semiconductor with a peak nitrogen concentration at a depth below the semiconductor surface substantially corresponding to said preselected depth;
   (c) implanting boron or boron-containing ions into the semiconductor surface, the implantation conditions chosen for providing a preselected, approximately parabolically-shaped boron concentration distribution profile within said semiconductor with a peak boron concentration at a depth below the semiconductor surface which is above, below, or substantially at said nitrogen concentration peak; and
   (d) thermally treating the nitrogen and boron-implanted semiconductor at a temperature and for an interval sufficient to convert said parabolically-shaped boron concentration distribution profile into a retrograde-shaped profile comprising, in order from the semiconductor surface, a first, substantially constant concentration portion, a second, substantially parabolically-shaped varying concentration portion having a peak concentration, and a third, substantially constant concentration portion, wherein said peak of said second, parabolically-shaped varying concentration portion substantially corresponds to said preselected depth below the semiconductor surface.

2. The method as in claim 1, wherein the boron concentrations in said first and third, substantially constant concentration portions of said retrograde-shaped profile are approximately equal.

3. The method as in claim 1, wherein step (a) comprises providing a monocrystalline silicon (Si) semiconductor wafer of n-type or intrinsic (i-type) conductivity.

4. The method as in claim 3, wherein said preselected depth is about 800 Å below the semiconductor surface.

5. The method as in claim 3, wherein step (b) comprises implanting $N^+$ or $N_2^+$ ions at a dosage of from about $1\times10^{14}$ to about $3\times10^{15}$ atoms/cm$^2$ at an energy of from about 2 KeV to about 50 KeV.

6. The method as in claim 3, wherein step (c) comprises implanting $B^+$ or $BF_2^+$ ions at a dosage of from about $1\times10^{12}$ to about $5\times10^{13}$ atoms/cm$^2$ at an energy of from about 2 KeV to about 50 KeV.

7. The method as in claim 3, wherein step (d) comprises rapid thermal annealing (RTA) at from about 850 to about 1,050° C. for from about 1 to about 30 seconds.

8. The method as in claim 3, wherein step (d) comprises furnace annealing at from about 750 to about 900° C. for from about 5 minutes to about 1 hour.

9. A method of manufacturing a semiconductor device comprising a semiconductor substrate having at least one pair of spaced-apart, boron-doped regions formed therein, each of said at least one pair of spaced-apart boron-doped regions having a retrograde-shaped boron concentration distribution profile exhibiting a peak boron concentration at a preselected depth below a surface of said semiconductor substrate, which method comprises the steps of:
   (a) providing an n-type semiconductor wafer having a surface;
   (b) implanting nitrogen ions into at least one pair of preselected, spaced-apart regions of said semiconductor wafer surface where source/drain regions are to be formed, the implantation conditions chosen for providing each of the implanted regions with a preselected, approximately parabolically-shaped nitrogen concentration distribution profile, with a peak nitrogen concentration at a depth below said semiconductor wafer surface substantially corresponding to said preselected depth;
   (c) implanting boron or boron-containing ions into said preselected, spaced-apart regions of said semiconductor wafer surface, the implantation conditions chosen for providing each of the regions with a preselected, approximately parabolically-shaped boron concentration distribution profile, with a peak boron concentration at a depth below the semiconductor wafer surface which is above, below, or substantially at said nitrogen concentration peak;
   (d) thermally treating the nitrogen- and boron-implanted semiconductor wafer at a temperature and for an interval sufficient to convert said parabolically-shaped boron concentration distribution profile of each of the implanted regions into a retrograde-shaped profile comprising, in order from the semiconductor wafer surface, a first, substantially constant concentration portion, a second, substantially parabolically-shaped varying concentration portion having a peak, and a third, substantially constant concentration portion, wherein the peak of said second, parabolically-shaped varying concentration portion substantially corresponds to said preselected depth below said semiconductor wafer surface; and
   (e) selectively forming a gate insulating layer on a preselected portion of said semiconductor wafer surface intermediate said implanted regions.

10. The method as in claim 9, wherein step (e) comprises selectively removing portions of an insulating layer formed over said semiconductor wafer surface during step (d).

11. The method as in claim 10, wherein the boron concentrations in said first and third portions of said retrograde profile are substantially equal.

12. The method as in claim 9, wherein step (a) comprises providing a monocrystalline Si wafer of n-type conductivity.

13. The method as in claim 12, wherein said preselected depth is about 800 Å below the semiconductor wafer surface.

14. The method as in claim 12, wherein step (b) comprises implanting $N^+$ or $N_2^+$ ions at a dosage of from about $1 \times 10^{14}$ to about $3 \times 10^{15}$ atoms/cm$^2$ at an energy of from about 2 KeV to about 50 KeV.

15. The method as in claim 12, wherein step (c) comprises implanting $B^+$ or $BF_2^+$ ions at a dosage of from about $1 \times 10^{12}$ to about $5 \times 10^{13}$ atoms/cm$^2$ at an energy of from about 2 KeV to about 50 KeV.

16. The method as in claim 12, wherein step (d) comprises rapid thermal annealing at from about 850 to about 1,050° C. for from about 1 to about 30 seconds.

17. The method as in claim 12, wherein step (d) comprises furnace annealing at from about 750 to about 900° C. for from about 5 minutes to about 1 hour.

18. The method as in claim 17, comprising: performing said furnace annealing in an oxygen-containing atmosphere for forming a silicon oxide insulating layer over said wafer surface and wherein step (e) comprises selectively removing portions of said silicon oxide insulating layer to thereby selectively form said gate insulating layer intermediate said implanted regions of said wafer.

19. The method as in claim 18, wherein step (f) comprises forming a heavily-doped polysilicon gate electrode layer.

* * * * *